US010215809B2

United States Patent
Mills et al.

(10) Patent No.: US 10,215,809 B2
(45) Date of Patent: Feb. 26, 2019

(54) METHOD AND SYSTEM FOR VERIFICATION OF CONTACT OPERATION

(71) Applicant: Carrier Corporation, Farmington, CT (US)

(72) Inventors: Bryan Mills, Litchfield, NH (US); James Pelletier, Hudson, NH (US); Oduwa Osagiede, Salem, NH (US); Ronie Lavon, Derry, NH (US)

(73) Assignee: CARRIER CORPORATION, Farmington, CT (US)

( * ) Notice: Subject to any disclaimer, the term of this patent is extended or adjusted under 35 U.S.C. 154(b) by 270 days.

(21) Appl. No.: 15/355,372

(22) Filed: Nov. 18, 2016

(65) Prior Publication Data

US 2017/0146601 A1    May 25, 2017

Related U.S. Application Data

(60) Provisional application No. 62/259,256, filed on Nov. 24, 2015.

(51) Int. Cl.
| | | |
|---|---|---|
| *H01H 1/00* | (2006.01) | |
| *G01R 31/327* | (2006.01) | |
| *H01H 1/58* | (2006.01) | |

(52) U.S. Cl.
CPC ....... *G01R 31/3278* (2013.01); *H01H 1/0015* (2013.01); *G01R 31/3277* (2013.01); *H01H 1/58* (2013.01)

(58) Field of Classification Search
CPC ............ G01R 31/3277; G01R 31/3278; H01H 1/0015; H01H 1/58

(Continued)

(56) References Cited

U.S. PATENT DOCUMENTS 3,433,572 A * 3/1969 Giuffrida ................ F23N 5/082
                                                                431/31
3,586,961 A * 6/1971 Rovnyak ............ G01R 31/3278
                                                                324/419

(Continued)

FOREIGN PATENT DOCUMENTS

| GB | 1468984 A | 3/1977 | |
| JP | 58039964 A * | 3/1983 | ......... G01R 31/3278 |

OTHER PUBLICATIONS

Lu Jianguo, Li Zhigang and Wang Jinqin, "The device of research on relay contact reliability," Thirty-Sixth IEEE Conference on Electrical Contacts, and the Fifteenth International Conference on Electrical Contacts, Montreal, Quebec, Canada, 1990, pp. 102-109. (Year: 1990).*

(Continued)

*Primary Examiner* — Jermele M Hollington
*Assistant Examiner* — Sean Curtis
(74) *Attorney, Agent, or Firm* — Cantor Colburn LLP

(57) ABSTRACT

A system for verifying operation of a contact includes a voltage source connected to a first terminal of the contact through a first switch; a second switch connected to a second terminal of the contact; a third switch connected to the second terminal of the contact; a voltage output connected to the second switch and the third switch; and a controller to compare the voltage output to a first voltage and a second voltage; wherein the voltage output indicates operation of the contact in response to status of the first switch, the switch and the third switch.

24 Claims, 3 Drawing Sheets

(58) Field of Classification Search
USPC ....... 324/415, 418, 422, 500, 507, 512, 522, 324/537, 555; 340/500, 540, 635, 644, 340/3.1, 3.22, 3.43, 3.8; 361/99, 157, 361/160, 170, 179, 206, 211, 819; 702/57, 58, 59, 127, 182, 183, 185

See application file for complete search history.

(56) References Cited

U.S. PATENT DOCUMENTS

| | | | |
|---|---|---|---|
| 3,727,073 A * | 4/1973 | Cade | F23N 5/123 307/117 |
| 3,741,709 A | 6/1973 | Clark | |
| 3,758,260 A | 9/1973 | Newport, Jr. et al. | |
| 3,822,398 A * | 7/1974 | Rovnyak | G01R 31/3278 324/419 |
| 3,941,553 A | 3/1976 | Bedford | |
| 3,967,255 A | 6/1976 | Oliver et al. | |
| 4,000,961 A * | 1/1977 | Mandock | F23N 5/123 307/117 |
| RE29,143 E | 2/1977 | Bianchini | |
| 4,177,419 A * | 12/1979 | Fiorentzis | G01R 31/3277 324/418 |
| 4,226,581 A | 10/1980 | Schilling | |
| 4,278,419 A | 7/1981 | Bechtel et al. | |
| 4,303,385 A * | 12/1981 | Rudich, Jr. | F23N 5/203 431/70 |
| 4,382,770 A * | 5/1983 | Pinckaers | F23N 5/123 431/18 |
| 4,412,328 A | 10/1983 | Homa | |
| 4,686,478 A * | 8/1987 | Jabs | G01R 31/3278 324/420 |
| 4,872,828 A | 10/1989 | Mierzwinski et al. | |
| 4,955,806 A | 9/1990 | Grunden et al. | |
| 5,065,101 A * | 11/1991 | Ledbetter | G01R 31/3278 324/415 |
| 5,122,661 A * | 6/1992 | Kruszewski | G01D 18/00 250/252.1 |
| 5,277,575 A * | 1/1994 | Newberry | F23N 5/203 431/24 |
| 5,506,569 A * | 4/1996 | Rowlette | F23N 5/203 110/185 |
| 5,549,469 A * | 8/1996 | Wild | F23N 5/082 431/72 |
| 5,599,180 A | 2/1997 | Peters et al. | |
| 5,863,194 A | 1/1999 | Kadah et al. | |
| 6,621,270 B2 * | 9/2003 | Johnson | G01R 31/3278 324/418 |
| 6,942,482 B2 | 9/2005 | Honda et al. | |
| 7,008,217 B2 * | 3/2006 | Jacobberger | F23N 5/206 431/18 |
| 7,208,955 B2 * | 4/2007 | Zansky | G01R 31/3277 324/418 |
| 7,492,269 B2 | 2/2009 | Matteson et al. | |
| 8,212,389 B2 * | 7/2012 | Morimoto | H01H 47/043 307/125 |
| 8,456,171 B2 * | 6/2013 | Matsuno | G01R 35/00 324/418 |
| 2003/0132752 A1 * | 7/2003 | Johnson | G01R 31/3278 324/418 |
| 2004/0085071 A1 * | 5/2004 | Sankey | G01R 31/3278 324/418 |
| 2010/0085060 A1 * | 4/2010 | Ichikawa | G01R 31/3277 324/503 |
| 2011/0019328 A1 * | 1/2011 | Morimoto | H01H 47/043 361/160 |
| 2012/0288806 A1 * | 11/2012 | Racaj | F23N 5/123 431/18 |
| 2014/0333311 A1 * | 11/2014 | Liu | G01R 31/327 324/418 |
| 2014/0354287 A1 * | 12/2014 | Eziyi | G01R 31/3278 324/418 |
| 2017/0146601 A1 * | 5/2017 | Mills | G01R 31/3278 |

OTHER PUBLICATIONS

Coto Technology, Testing Reed Switches and Relays for Reliablity, Jan. 2015 (Year: 2015).*

TE Connectivity, Application Note for General Purpose Relays: Verification and Diagnosis of Suspected Relay Failures. Jun. 2013 (Year: 2013).*

BFI Automation Dipl.-Ing. K.-H., Mindermnn GmBH, "Flame Scanner 3.32 Technical Description", Edition: TB 3.32-SZ1, 2012, 4 pages.

Fireeye, "UVM and TFM Flame Safeguard Controls", C-400. Feb. 1993, pp. 1-12.

Honeywell, "R7824, R7847, R7848, R7849, R7861, R7886 Amplifiers for 7800 Series Relay Modules", 65-0109-6 G. Rev 7-98, 1998, pp. 1-8.

* cited by examiner

METHOD AND SYSTEM FOR VERIFICATION OF CONTACT OPERATION

CROSS-REFERENCE TO RELATED APPLICATIONS

This application claims the benefit of U.S. provisional patent application Ser. No. 62/259,256, filed Nov. 24, 2015, the entire contents of which are incorporated herein by reference.

BACKGROUND

The present disclosure relates generally to verifying operation of a remotely mounted contactor type switch that can be safely measured to be closed by a measurement system connected over a wire. An exemplary system includes a flame scanner with an internal relay connected to a burner management system that detects when the flame scanner relay contact has closed, thereby indicating the presence of a flame. If a flame is not detected, then the flame relay is open.

It is known in the art to test the flame relay circuitry to confirm proper operation. It is desirable to determine if the flame relay is closed or if a short circuit has occurred across the flame relay, which results in a false indication of flame presence. Existing designs place a known resistance in series with the flame relay and apply a static current across the resistor when the relay is closed. If the proper resistance is measured by the static current, this indicates that the flame relay is closed. However, determining the closure of the flame relay by measuring the resistance with a static current or voltage does not allow for a fail-safe system for all known failure modes. Numerous other component failures in the system may falsely indicate a closed flame relay in a static system (e.g., leakage voltage on a detection circuit board, crosstalk on wiring to/from the flame relay, a damaged A/D converter, faulty drive current, etc.). A more thorough detection of proper contact operation via dynamic drive current would be well received in the art.

SUMMARY

In one embodiment, a system for verifying operation of a contact includes a voltage source connected to a first terminal of the contact through a first switch; a second switch connected to a second terminal of the contact; a third switch connected to the second terminal of the contact; a voltage output connected to the second switch and the third switch; and a controller to compare the voltage output to a first voltage and a second voltage; wherein the voltage output indicates operation of the contact in response to status of the first switch, the switch and the third switch.

In addition to one or more of the features described above, or as an alternative, further embodiments may include wherein when the second switch is off, the third switch is on and when the second switch is on, the third switch is off.

In addition to one or more of the features described above, or as an alternative, further embodiments may include wherein a fault condition is detected when the voltage output exceeds the first voltage.

In addition to one or more of the features described above, or as an alternative, further embodiments may include wherein a no change condition is detected when the first switch is off and the voltage output is below a low limit.

In addition to one or more of the features described above, or as an alternative, further embodiments may include wherein a fault condition is detected when the first switch is off and the voltage output is above a low limit.

In addition to one or more of the features described above, or as an alternative, further embodiments may include wherein the contact is determined to be off when first switch is on, the second switch is off and the output voltage is less than the second voltage.

In addition to one or more of the features described above, or as an alternative, further embodiments may include wherein the contact is determined to be on when first switch is on, the second switch is off and the output voltage equals the second voltage.

In addition to one or more of the features described above, or as an alternative, further embodiments may include wherein a fault condition is detected when the first switch is on, the second switch is off and the output voltage is greater than the second voltage.

In addition to one or more of the features described above, or as an alternative, further embodiments may include wherein the contact is determined to be off when first switch is on, the second switch is on and the output voltage is less than the first voltage.

In addition to one or more of the features described above, or as an alternative, further embodiments may include wherein the contact is determined to be on when first switch is on, the second switch is on and the output voltage equals the first voltage.

In addition to one or more of the features described above, or as an alternative, further embodiments may include wherein the first voltage comprises a first voltage range and the second voltage comprises a second voltage range.

In addition to one or more of the features described above, or as an alternative, further embodiments may include wherein the contact is a flame relay.

In another embodiment, a method for verifying operation of a contact includes connecting a voltage source to a first terminal of the contact through a first switch; connecting a second switch to a second terminal of the contact; connecting a third switch to the second terminal of the contact; connecting a voltage output to the second switch and the third switch; and comparing the voltage output to a first voltage and a second voltage; wherein the voltage output indicates operation of the contact in response to status of the first switch, the second switch and the third switch.

In addition to one or more of the features described above, or as an alternative, further embodiments may include wherein when the second switch is off, the third switch is on and when the second switch is on, the third switch is off.

In addition to one or more of the features described above, or as an alternative, further embodiments may include detecting a fault condition when the voltage output exceeds the first voltage.

In addition to one or more of the features described above, or as an alternative, further embodiments may include detecting a no change condition when the first switch is off and the voltage output is below a low limit.

In addition to one or more of the features described above, or as an alternative, further embodiments may include detecting a fault condition when the first switch is off and the voltage output is above a low limit.

In addition to one or more of the features described above, or as an alternative, further embodiments may include determining the contact to be off when first switch is on, the second switch is off and the output voltage is less than the second voltage.

In addition to one or more of the features described above, or as an alternative, further embodiments may include determining the contact to be on when first switch is on, the second switch is off and the output voltage equals the second voltage.

In addition to one or more of the features described above, or as an alternative, further embodiments may include detecting a fault condition when the first switch is on, the second switch is off and the output voltage is greater than the second voltage.

In addition to one or more of the features described above, or as an alternative, further embodiments may include determining the contact to be off when first switch is on, the second switch is on and the output voltage is less than the first voltage.

In addition to one or more of the features described above, or as an alternative, further embodiments may include determining the contact to be on when first switch is on, the second switch is on and the output voltage equals the first voltage.

In addition to one or more of the features described above, or as an alternative, further embodiments may include wherein the first voltage comprises a first voltage range and the second voltage comprises a second voltage range.

In addition to one or more of the features described above, or as an alternative, further embodiments may include wherein the contact is a flame relay.

The foregoing features and elements may be combined in various combinations without exclusivity, unless expressly indicated otherwise. These features and elements as well as the operation thereof will become more apparent in light of the following description and the accompanying drawings. However, it should be understood that the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
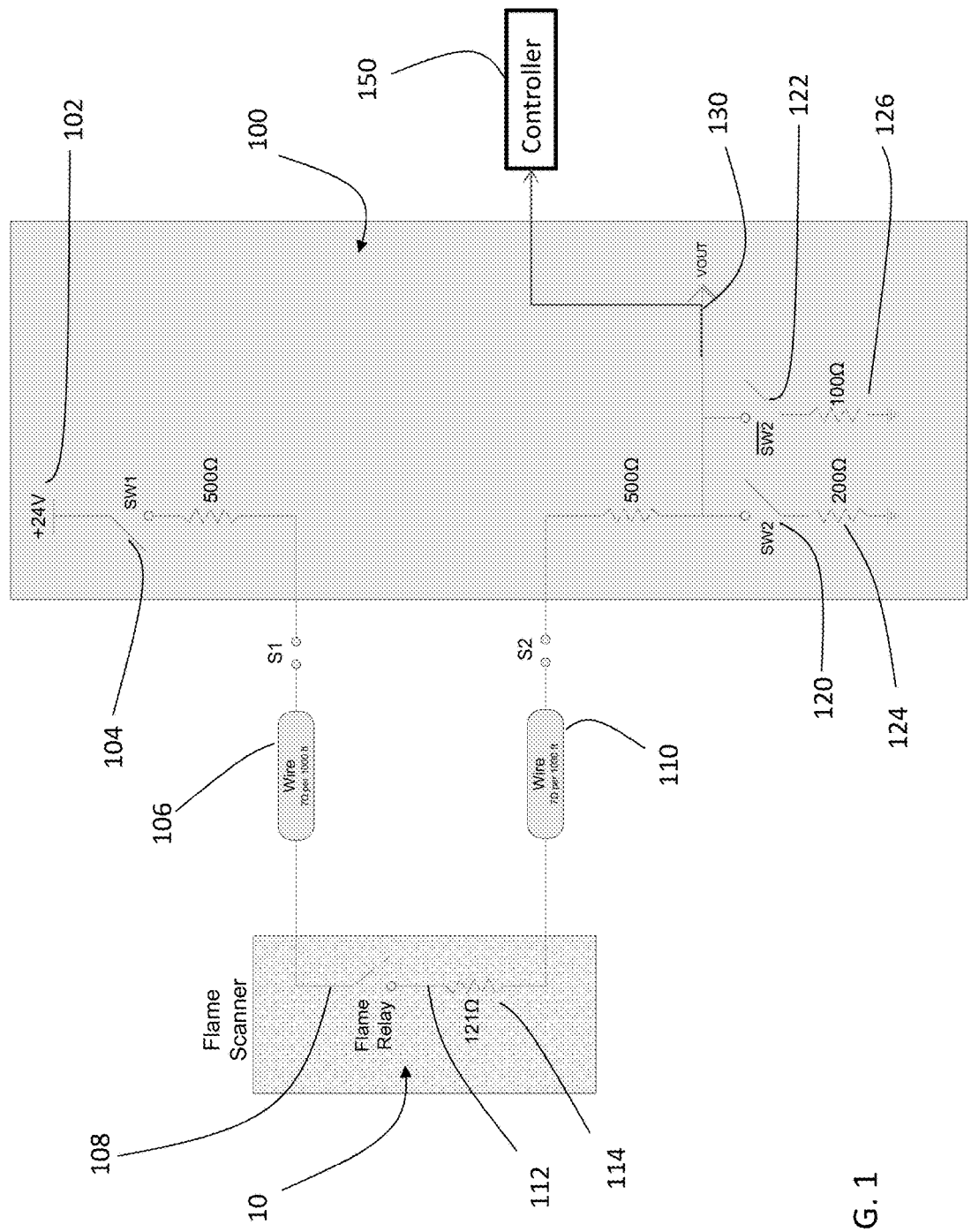
FIG. 1 depicts a flame relay and flame sensing circuit in an exemplary embodiment.

Embodiments include systems and methods for verifying proper operation of a remote contact. In the example in FIG. 1, the remote contact is a flame relay. It is understood that other types of contacts may be monitored, and embodiments are not limited to flame relays. FIG. 1 depicts a flame relay 10 and a flame sensing circuit 100 in an exemplary embodiment. The flame sensing circuit 100 includes a voltage source 102, which in the exemplary embodiment of FIG. 1 is 24 volts DC. It is understood that other voltage values may be used. The voltage source 102 is connected to a first switch 104. The first switch 104 may be implemented using a relay, transistor, or other controllable switching element.

A first wire 106 connects the first switch 104 to a first terminal 108 of the flame relay 10. A second wire 110 connects a second terminal 112 of the flame relay 10 to a second switch 120 and a third switch 122. A known resistance 114 is in series with the second wire 110, located after the flame relay 10 and before the second wire 110. The second switch 120 and the third switch 122 may be implemented using a relay, transistor, or other controllable switching element. Although both are shown in an open state in FIG. 1, the second switch 120 and the third switch 122 have inverted states, such that when the second switch 120 is open, the third switch 122 is closed, and when the second switch 120 is closed, the third switch 122 is open.

The second switch 120 is connected to ground through a first resistance 124. The third switch 122 is connected to ground through a second resistance 126. The first resistance 124 and the second resistance 126 have different values, so that a voltage output 130 is dependent on whether the second switch 120 is closed or open. The voltage output 130 is located at a junction of terminals of the second switch 120 and the third switch 122 and second wire 110.

In operation, a controller 150 tests functionality of the flame relay 10 and the flame sensing circuit 100 by controlling the status of the first switch 104, the second switch 120 and the third switch 122. The controller 150 can independently control the first switch 104, the second switch 120 and the third switch 122. The controller 150 monitors the voltage output 130 to confirm that an anticipated voltage is present, as described in further detail herein. The controller 150 may include an analog-to-digital converter to convert the voltage output 130 from analog to digital format. The controller 150 may be a general-purpose microprocessor executing software to perform the operations described herein.

Table 1 below is a truth table providing a correlation between switch states, voltage output and status.

TABLE 1

| SW1 | SW2 | $V_{out}$ | Status |
|---|---|---|---|
| X | X | $>V_B$ | Fault |
| 0 | X | $<0.25$ V | No change |
| 0 | X | $>0.25$ V | Fault |
| 1 | 0 | $<V_A$ | No Flame |
| 1 | 0 | $V_A$ | Flame |
| 1 | 0 | $>V_A$ | Fault |
| 1 | 1 | $<V_B$ | No Flame |
| 1 | 1 | $V_B$ | Flame |

As shown in Table 1, for various states of the first switch 104 and the second switch 120 (and hence the third switch 122), a certain voltage output 130 indicates status of the flame relay 10. The controller 150 controls states of the first switch 104 and the second switch 120 (and hence the third switch 122) and monitors the voltage output 130 to determine the status of the flame relay 10. By monitoring the voltage output 130, the controller 150 can compare the measured result to a predicted result and confirm proper operation of the flame relay 10 and the monitoring thereof by the flame sensing circuit 100. No flame refers to a condition where the flame relay 10 is open or off. Flame refers to a condition where the flame relay 10 is closed or on.

Figure 2:
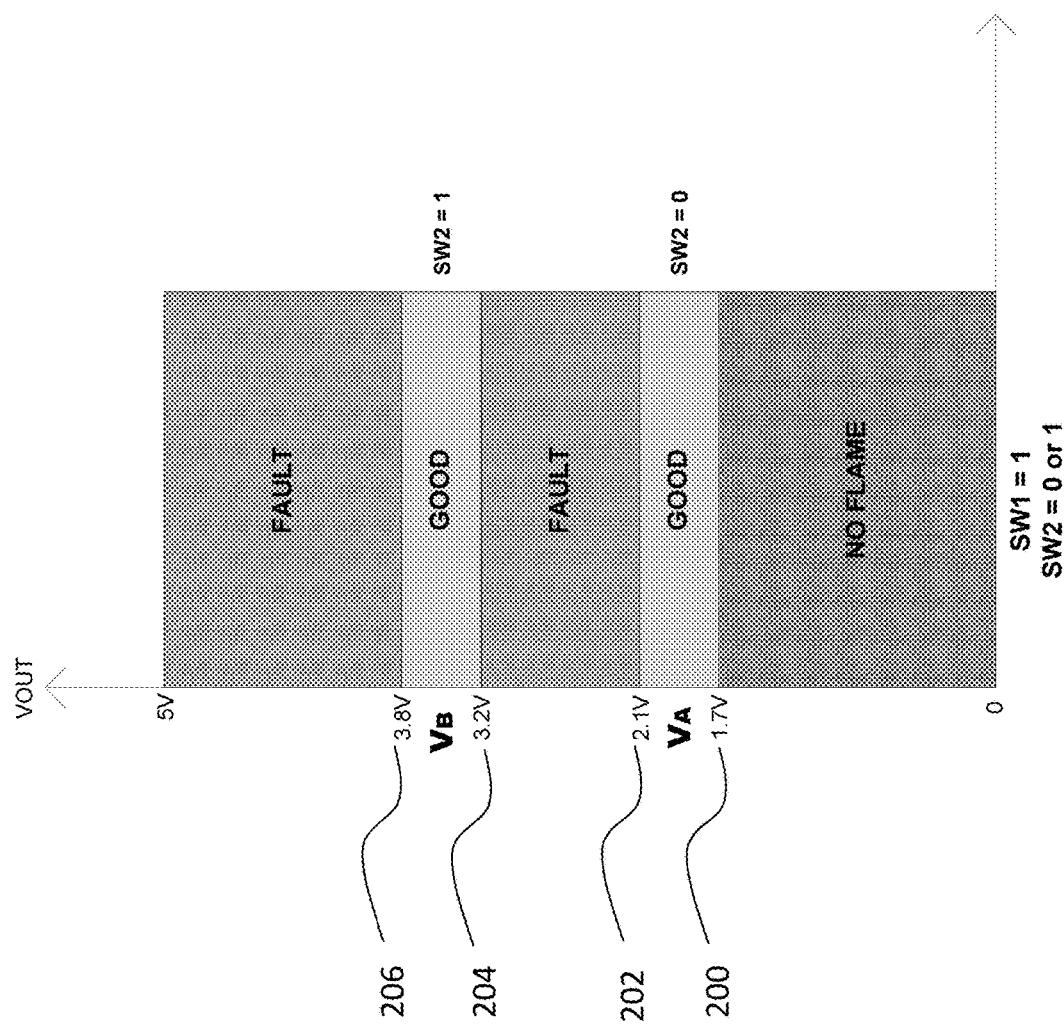
FIG. 2 depicts voltage measurements used for detecting proper flame relay operation in an exemplary embodiment.

As shown in Table 1, the controller 150 may compare the output voltage 130 to various voltage ranges, referenced as $V_A$ and $V_B$. FIG. 2 illustrates exemplary voltage ranges, including $V_A$ and $V_B$. A first voltage range $V_B$ is defined as between a threshold 204 and a threshold 206, which in FIG. 2 are 3.2 volts and 3.8 volts, respectively. A second voltage range $V_A$ is defined as between a threshold 200, which in FIG. 2 is 1.7 volts, and a threshold 202, which in FIG. 2 is 2.1 volts. If the voltage output 130 is between threshold 202 and threshold 204, or above the threshold 206, then the controller 150 interprets this as a fault as shown in FIG. 2. These fault voltage levels are out of the predicted ranges and indicate that some source of additional voltage (e.g., noise, faulty A/D) is present. The controller 150 can communicate the fault condition to maintenance personnel for further diagnosis. The thresholds in FIG. 2 are exemplary and it is understood that other values may be used. Further, the reference voltages $V_A$ and $V_B$ may be single voltages rather than voltage ranges.

Figure 3:
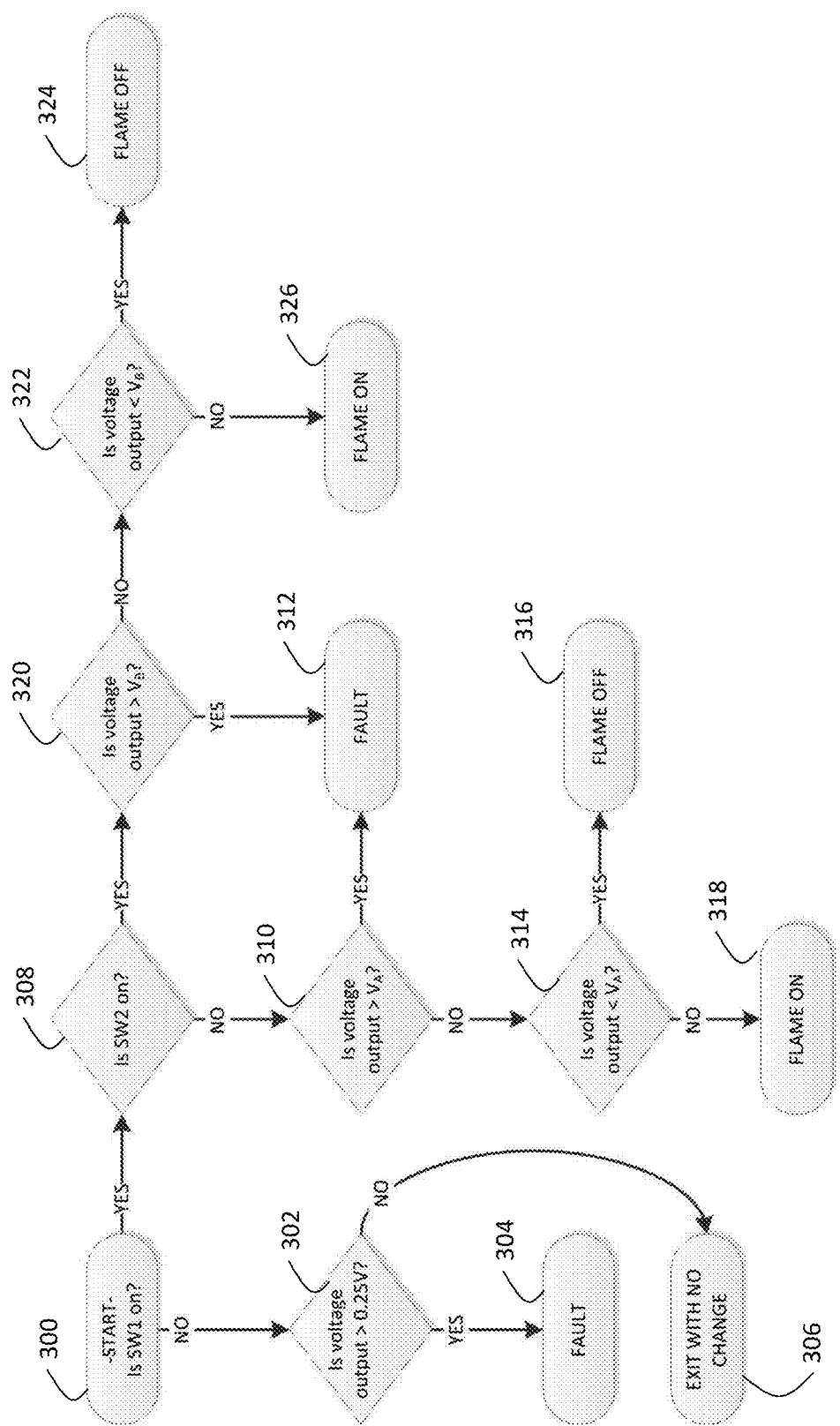
FIG. 3 depicts a method of verifying operation of a flame relay in an exemplary embodiment.

FIG. 3 depicts a process for verifying operation of the flame relay 10 in an exemplary embodiment. The process begins at 300 where the controller 150 determines if the first switch 104 is on (e.g., closed or conducting). If not, flow proceeds to 302 where the controller 150 determines if the voltage output 130 is greater than a low limit (e.g., 0.25 volts). If so, flow proceeds to 304 where a fault is detected. If not, flow proceeds to 306, where the process may be exited without any change in the current state of the flame relay 10.

If at 300, the first switch 104 is closed, flow proceeds to 308. At 308, the controller 150 determines if the second switch 120 is on. If the second switch 120 is not on, flow proceeds to 310 where the controller 150 determines if the voltage output 130 is greater than $V_A$. If so, flow proceeds to 312 where a fault is detected.

If at 310, the voltage output 130 is not greater than $V_A$, flow proceeds to 314 where the controller 150 determines if the voltage output 130 is less than $V_A$. At 314, if the voltage output 130 is less than $V_A$, then a flame off condition is determined at 316. At 314, if the voltage output 130 is not less than $V_A$, then a flame on condition is determined at 318.

If at 308, the second switch 120 is on, flow proceeds to 320 where the controller 150 determines if the voltage output 130 is greater than $V_B$. If the voltage output 130 is greater than $V_B$, then flow proceeds to 312 where a fault is detected. If at 320, the voltage output 130 is not greater than $V_B$, flow proceeds to 322 where the controller 150 determines if the voltage output 130 is less than $V_B$. If the voltage output 130 is less than $V_B$, flow proceeds to 324 where a flame off condition is determined. If the voltage output 130 is not less than $V_B$, flow proceeds to 326 where a flame on condition is determined.

Embodiments use multiple switches in order to measure a voltage output under different conditions and confirm proper operation of a flame relay and associated wiring, circuitry, etc. By using at least two switches, the system can ensure that a correct expected voltage is present at a voltage output under different conditions, and confirm that the voltage output is not due to spurious or intermittent causes.

While the present disclosure is described with reference to exemplary embodiments, it will be understood by those skilled in the art that various changes may be made and equivalents may be substituted without departing from the scope of the present disclosure. In addition, various modifications may be applied to adapt the teachings of the present disclosure to particular situations, applications, and/or materials, without departing from the essential scope thereof. The present disclosure is thus not limited to the particular examples disclosed herein, but includes all embodiments falling within the scope of the appended claims.

What is claimed is:

1. A system for verifying operation of a contact, the system comprising:
   a voltage source connected to a first terminal of the contact through a first switch;
   a second switch connected to a second terminal of the contact;
   a third switch connected to the second terminal of the contact;
   a voltage output connected to the second switch and the third switch; and
   a controller to compare the voltage output to a first voltage and a second voltage;
   wherein the voltage output indicates operation of the contact in response to status of the first switch, the switch and the third switch.

2. The system of claim 1 wherein:
   when the second switch is off, the third switch is on and when the second switch is on, the third switch is off.

3. The system of claim 1 wherein:
   a fault condition is detected when the voltage output exceeds the first voltage.

4. The system of claim 1 wherein:
   a no change condition is detected when the first switch is off and the voltage output is below a low limit.

5. The system of claim 1 wherein:
   a fault condition is detected when the first switch is off and the voltage output is above a low limit.

6. The system of claim 1 wherein:
   the contact is determined to be off when first switch is on, the second switch is off and the output voltage is less than the second voltage.

7. The system of claim 1 wherein:
   the contact is determined to be on when first switch is on, the second switch is off and the output voltage equals the second voltage.

8. The system of claim 1 wherein:
   a fault condition is detected when the first switch is on, the second switch is off and the output voltage is greater than the second voltage.

9. The system of claim 1 wherein:
   the contact is determined to be off when first switch is on, the second switch is on and the output voltage is less than the first voltage.

10. The system of claim 1 wherein:
    the contact is determined to be on when first switch is on, the second switch is on and the output voltage equals the first voltage.

11. The system of claim 1 wherein:
    the first voltage comprises a first voltage range and the second voltage comprises a second voltage range.

12. The system of claim 1 wherein:
    the contact is a flame relay.

13. A method for verifying operation of a contact, the method comprising:
    connecting a voltage source to a first terminal of the contact through a first switch;
    connecting a second switch to a second terminal of the contact;
    connecting a third switch to the second terminal of the contact;
    connecting a voltage output to the second switch and the third switch; and comparing the voltage output to a first voltage and a second voltage;
    wherein the voltage output indicates operation of the contact in response to status of the first switch, the second switch and the third switch.

14. The method of claim 13 wherein:
    when the second switch is off, the third switch is on and when the second switch is on, the third switch is off.

15. The method of claim 13 further comprising:
detecting a fault condition when the voltage output exceeds the first voltage.
16. The method of claim 13 further comprising:
detecting a no change condition when the first switch is off and the voltage output is below a low limit.
17. The method of claim 13 further comprising:
detecting a fault condition when the first switch is off and the voltage output is above a low limit.
18. The method of claim 13 further comprising:
determining the contact to be off when first switch is on, the second switch is off and the output voltage is less than the second voltage.
19. The method of claim 13 further comprising:
determining the contact to be on when first switch is on, the second switch is off and the output voltage equals the second voltage.
20. The method of claim 13 further comprising:
detecting a fault condition when the first switch is on, the second switch is off and the output voltage is greater than the second voltage.
21. The method of claim 13 further comprising:
determining the contact to be off when first switch is on, the second switch is on and the output voltage is less than the first voltage.
22. The method of claim 13 further comprising:
determining the contact to be on when first switch is on, the second switch is on and the output voltage equals the first voltage.
23. The method of claim 13 wherein:
the first voltage comprises a first voltage range and the second voltage comprises a second voltage range.
24. The method of claim 13 wherein:
the contact is a flame relay.

* * * * *